(12) United States Patent
Timme

(10) Patent No.: US 7,834,720 B2
(45) Date of Patent: Nov. 16, 2010

(54) BULK ACOUSTIC WAVE FILTER DEVICE AND A METHOD FOR TRIMMING A BULK ACOUSTIC WAVE FILTER DEVICE

(75) Inventor: Hans-Joerg Timme, Ottobrunn (DE)

(73) Assignee: Avago Technologies Wireless IP (Singapore) Pte. Ltd., Singapore (SG)

( * ) Notice: Subject to any disclaimer, the term of this patent is extended or adjusted under 35 U.S.C. 154(b) by 170 days.

(21) Appl. No.: 12/166,120

(22) Filed: Jul. 1, 2008

(65) Prior Publication Data

US 2010/0001813 A1 Jan. 7, 2010

(51) Int. Cl.
*H03H 9/00* (2006.01)
*H03H 9/205* (2006.01)

(52) U.S. Cl. ........................................ 333/187; 333/189

(58) Field of Classification Search .................. 333/187, 333/188, 189, 190, 191, 192; 310/321
See application file for complete search history.

(56) References Cited

U.S. PATENT DOCUMENTS

| | | | | |
|---|---|---|---|---|
| 6,864,619 | B2 * | 3/2005 | Aigner et al. | 310/321 |
| 7,339,445 | B2 * | 3/2008 | Aigner et al. | 333/133 |
| 7,439,824 | B2 * | 10/2008 | Aigner et al. | 333/187 |
| 2003/0179053 | A1 * | 9/2003 | Aigner et al. | 333/189 |

* cited by examiner

*Primary Examiner*—Dean O Takaoka

(57) ABSTRACT

A bulk acoustic wave (BAW) filter device includes at least one first serial BAW resonator, at least one first shunt BAW resonator, at least one second serial BAW resonator or at least one second shunt BAW resonator. The resonance frequencies of the first and the second serial BAW resonators or the resonance frequencies of the first and the second shunt BAW resonators are detuned with respect to each other.

17 Claims, 13 Drawing Sheets

BULK ACOUSTIC WAVE FILTER DEVICE AND A METHOD FOR TRIMMING A BULK ACOUSTIC WAVE FILTER DEVICE

BACKGROUND

The present invention relates to the field of bulk acoustic wave filters (Bulk Acoustic Wave=BAW) and especially to an improvement of the roll-off behavior of BAW bandpass filters.

SUMMARY OF THE INVENTION

Embodiments of the present invention relate to a BAW filter device including at least one first serial BAW resonator, at least one first shunt BAW resonator, at least one second serial BAW resonator or at least one second shunt BAW resonator. The resonance frequencies of the first and the second serial BAW resonators or the resonance frequencies of the first and the second shunt BAW resonators are detuned with respect to each other.

Further embodiments are related to a bulk acoustic wave filter device including a first and a second port, each port including a first and a second terminal, wherein a first current path connects the first terminal of the first port with the first terminal of the second port, and wherein a second current path connects the second terminal of the first port with the second terminal of the second port. The BAW filter device further including a first BAW resonator and a second BAW resonator, which are electrically connected in series along the first current path and a third BAW resonator connecting the first current path between the first and second BAW resonators with the second current path. The first and second BAW resonators include resonance frequencies, which differ by an amount above a manufacturing tolerance.

BRIEF DESCRIPTION OF THE DRAWINGS

Features of embodiments of the present invention will be more readily appreciated and better understood with reference to the following detailed description, which should be considered with reference to the accompanying drawings, in which.

Figure 1:
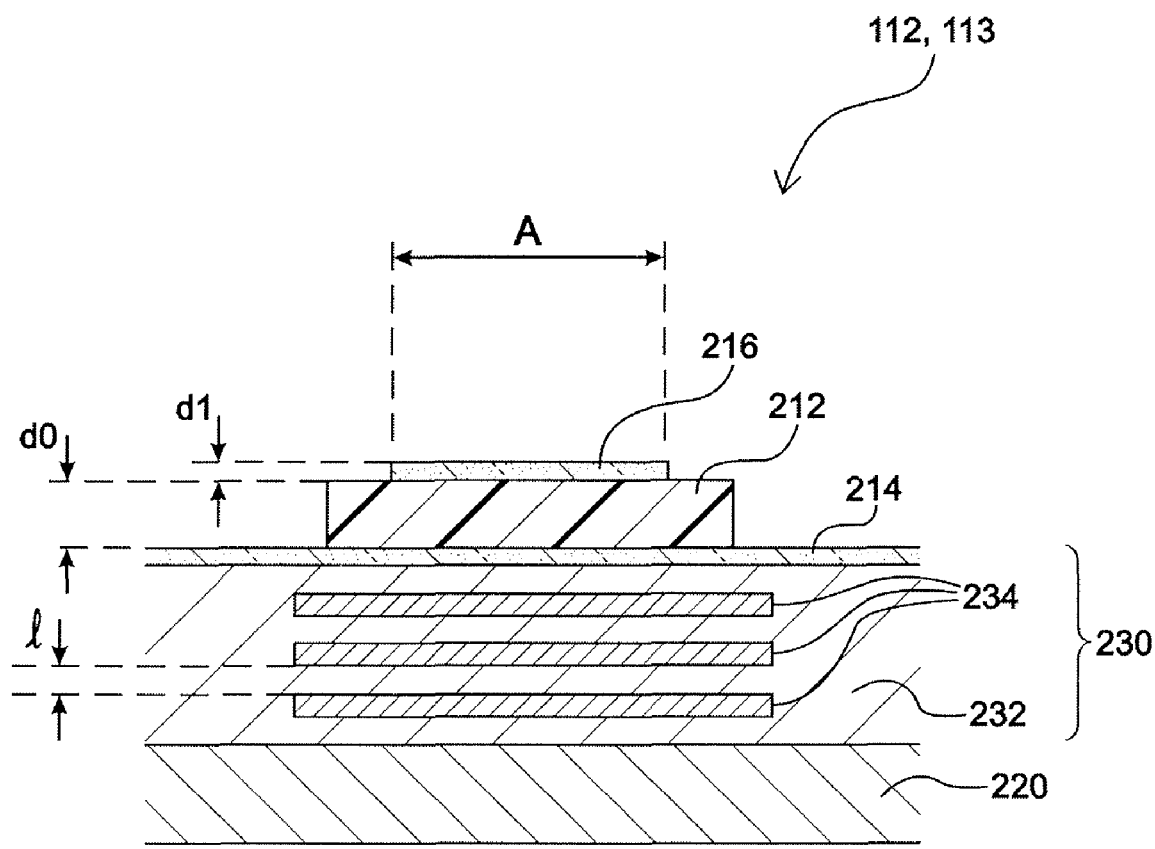
FIG. 1 shows a conventional BAW device (cross section of BAW resonator solidly mounted on an acoustic mirror structure)

Before embodiments of the present invention are explained in more detail below with reference to the drawings, it is to be noted that equal elements of those operating in an equal manner are provided with the same or similar reference numerals in the figures, and that a repeated description of these elements is omitted.

DETAILED DESCRIPTION OF ILLUSTRATIVE EMBODIMENTS

Mobile communication standards need highly selective frequency filters. Corresponding requirements are especially strong for PCS duplexers, which are used, for example, in UMTS Band II and CDMA PCS mobile telephones (UMTS=universal mobile telecommunications service, CDMA=Code Division Multiple Access, PCS=personal communications system). Transmit (TX) and receive (RX) bands of a PCS duplexer include a frequency separation of 20 MHz only. For example, the PCS TX band covers a region between 1850 and 1910 MHz, and the PCS RX band includes the frequency range of 1930 to 1990 MHz. Both TX and RX bands have a bandwidth of 60 MHz each, and are separated by a guard band of 1930 MHz–1910 MHZ=20 MHz. As a consequence, the transmit (TX) filter should have a very small roll-off (i.e., steep skirt) at the upper TX passband frequency edge, whereas the receive (RX) filter should have a very small roll-off (steep skirt) at the lower RX passband frequency edge.

Filter roll-off behavior (roll-off performance) can be measured as frequency separation between, for example, two specific attenuation values for the insertion loss—for example, between the 30 dB and the 3 dB attenuation values of the lower or upper filter skirt, respectively.

Bulk acoustic wave filters are frequently used for PCS duplexers for the following reasons:

(1) BAW resonators offer a high quality factor Q; and (2) BAW resonators offer a small temperature coefficient of frequency (TCF).

Other conventional filters based on SAW resonators (SAW=surface acoustic wave) are known as SAW filters. In comparison to BAW resonators, SAW resonators offer a similar quality factor Q, but include a higher TCF (typically twice as large). The corresponding BAW filters and SAW filters share the temperature coefficients of frequency of their BAW and SAW resonators, respectively. In BAW technology, good TX ladder filters can offer a roll-off performance at the upper passband frequency of 9 MHz (with reference to the attenuation drop from 3 dB down to 30 dB). Higher roll-off parameters sensitively affect the duplexer's compliance to specification and, therefore, the production yield, which becomes zero for roll-off values around 12 MHz, for example.

Hence, there is a need to further improve the roll-off behavior of BAW filters, in order to improve the duplexer performance and, at the same time, the BAW filter production yield. This implies to further reduce the critical roll-off parameters.

The roll-offs of BAW filters are essentially governed by filter topology and design, the resonator performance (i.e., quality factor), and electrical parasitics like electrode and connector resistances, parasitic inductances, parasitic capacities, as well as by substrate resistivity. All of these parameters relevant for roll-off performance have nowadays been optimized (within the frameworks of the respective underlying BAW technologies). There are, however, several limitations:

(a) Generally, the filter roll-off behavior improves with the number of filter stages in a ladder filter, whereas the insertion loss increases. This increase of insertion loss limits the maximum number of stages. A typical ladder filter includes, for example, 3, 3½, or 4 stages, wherein each stage includes a series and a shunt resonator (and a "half" stage refers either to one shunt or one series resonator in a ladder filter topology, for example).

(b) Resonator quality factors Q are limited by electrical and acoustic losses.

(c) The filter designs including topology must address—based on available resonator performance—several issues simultaneously. These issues include, for example, the insertion loss, return loss, and ripple in the filter passband, as well as stopband and wideband attenuation. Especially, this means that the roll-off behavior cannot be optimized independently from other filter parameters. For most applications it is important to keep control over most of these parameters at the same time.

(d) The availability of low-loss substrates like, ideally, insulators, or semi-insulators, or at least high-ohmic silicon wafers may be limited (depending on used processing technologies).

(e) The temperature coefficient of frequency (TCF) of the BAW resonators transfers to a similar TCF of the BAW filter composed from such resonators. As a consequence, some frequency margin is needed to allow for TCF-caused temperature shifting of the filter passband frequency. This TCF margin is not available for filter roll-off. In other words, the smaller the resonator or filter TCF, the smaller the TCF margin and the larger the remaining tolerance for roll-off performance should be.

Embodiments of the present invention deal with these and other issues in that a device including a plurality of BAW resonators is proposed, wherein the BAW resonators are individually detuned, for example, by shifting (or adapting) their resonance frequencies in such a way that the critical filter roll-off is minimized. This minimization of the roll-off is achieved at the lower or higher filter passband edge as, for example, needed for the RX filter or the TX filter, respectively.

For this, embodiments of the present invention relate to a BAW filter device, including a first and second port, each port including a first and second terminal and a first current or signal path connects the first terminals and a second current or signal path connects the second terminals of the first and second ports (wherein one signal path can include a common ground). The BAW device includes moreover first and second BAW resonators, which are electrically connected in series along the first current path. In addition, a third BAW resonator connects the second current path to the first current path between the first and second BAW resonators. According to embodiments, the first and second BAW resonators are detuned such that their resonance frequencies differ by an amount above the manufacturing tolerance.

In further embodiments, the detuned first and second BAW resonators are both shunt resonators so that the first BAW resonator connects the first and second terminals of the first port, and the second BAW resonator connects first and second terminals of the second port. In this embodiment, the third BAW resonator is a series resonator along the first current path (between the first terminals of the first and second ports, for example).

High frequency BAW filters are, for example, composed of so-called series and shunt resonators utilized in ladder and/or lattice topologies. The shunt resonators are constructed in a similar way as the series resonators, but are shifted downwards in their resonance frequencies. This frequency shift (or detuning) typically corresponds to the resonator bandwidth (approximately), and is essential in creating the filter passband. Such frequency shifts are obtained when one or more layers of the resonator layer stacks differ (e.g., with respect to thicknesses or material) between series and shunt resonator types. In principle, individual layer stacks and thus individual resonance frequencies, can be assigned to every resonator used in a BAW filter. In order to keep design and processing efforts low, a typical realization includes only two resonator types, namely one used for series resonators and the other used for shunt resonators.

The shape of the filter passband depends on the circuit topology, the number of filter stages, the size of the individual resonator areas, and the quality factors of the resonators. In addition, electric and acoustic parasitics influence the filter performance.

The basic idea of the present invention can also be rephrased in the way that the resonator frequencies in a BAW filter are shifted and/or individually adapted in such a way that the resulting bandpass filter offers a minimized roll-off (steep filter skirt) at the lower or upper passband frequency edge. A possible guideline for a corresponding filter design should be to minimize a filter roll-off by using at least two different series resonator stacks, or at least two different shunt resonator layer stacks. Hence, at least one series (or one shunt) resonator should be shifted by a relative frequency amount (magnitude) of approximately 0.2% or larger (relative with respect to the resonance frequency or to the center passband frequency of the resulting filter). This corresponds, for example, to a shift of around 4 MHz or larger, for a series (or shunt) resonator of an exemplarily PCS TX bandpass filter. This shift comes on top of the relative shift between the resonant frequencies of the series and shunt resonators, which are used, e.g., to adjust the aforementioned filter bandwidth.

Thus, in order to minimize the critical roll-off, at least one resonator (in series or in shunt configuration) is shifted in frequency with respect to the other (series or shunt) resonators by a certain amount (with magnitude 0.2% or larger). In further embodiments, all shunt and series BAW resonators are individually detuned with respect to their resonance frequencies. By this means, using individual resonance frequencies, additional degrees of freedom become available for roll-off optimization, which is especially suitable in a given BAW technology. Realizing such frequency shifts by modifying certain layer thicknesses of individual BAW resonators has—although additional lithographic steps may be required—the advantage that resonator performance is not affected and that no additional passive components like coils or capacitors have to be introduced into the process, and accounted for in their parasitic effects on filter performance.

FIG. 1 shows a cross-sectional view of a BAW resonator, which can either, be used as a series BAW resonator 112, or as a shunt BAW resonator 113. The BAW resonator includes a piezoelectric layer 212 sandwiched between a first electrode 214 and a second electrode 216. The piezoelectric layer 212 includes a first thickness d0, and the second electrode 216 includes a second thickness d1. The first electrode 214 is formed on a substrate 220 with an acoustic mirror 230, wherein the acoustic mirror 230 includes a layer stack of layers (materials) with alternating low and high acoustic impedances. For example, the acoustic mirror 230 includes a material with low acoustic impedance 232, which is arranged on the substrate 220 and in which three layers of high acoustic impedance 234 are arranged and spaced from each other by a distance 1. In general, different materials may be used for the individual low acoustic impedance layers, and different materials may be used for the individual high acoustic impedance layers. The thicknesses of all individual layers may be different.

Both electrodes, the first and second electrodes 214, 216, are typically designed as layers covering a certain surface region of the piezoelectric layer 212. A resonator area or a resonator region A is thus given by the region, along which the piezoelectric layer 212 is sandwiched between the first and second electrodes 214 and 216. The first electrode 214, as well as the piezoelectric layer 212, extends in the embodiment as shown in FIG. 1, outside the resonator region A, and the acoustic mirror 230 is arranged between the substrate 220 and the first electrode 214 along the resonator region A. The first electrode 214 is also denoted as the bottom electrode, and the second electrode 216 as the top electrode, wherein top/bottom refers to the distance to the underlying substrate 220. The top electrode is typically used (and easily accessible) for a frequency trimming or detuning processes, which are based on measured resonance frequencies. Frequency trimming or detuning can also be performed by adjusting thicknesses of other layers in the resonator stack, of course, but such trimmings or adjustments should then be based on layer thickness measurements, for example.

The BAW resonator exhibits a resonance frequency, which depends on the complete layer stack of the BAW resonator. More precisely, each resonator offers two fundamental resonances, namely a so-called series resonance and a so-called parallel resonance. Both fundamental resonator frequencies are separated by the resonator bandwidth, which is essentially determined by the coupling strength of the piezoelectric layer, but also depends on other layers from the layer stack as well as on parasitics. For the simplicity of our arguments, we will simply refer to "the resonator frequency", whenever the two closely correlated fundamental resonator frequencies are meant. Tuning or trimming an individual BAW resonator will always affect both fundamental resonance frequencies in (quite precisely) the same way. The layer stack includes a sequence of different (individual) materials, each with certain material properties and thickness. For example, assuming a layer stack with given (selected) materials, the resonance frequency especially depends on the thickness d0 of the piezoelectric layer 212 as well as on the thickness d1 of the second electrode 216, as well as on the thickness of the first electrode 214. In addition, the resonance frequency depends on the material and the thickness of the piezoelectric layer 212, but also on the material of the first and second electrodes 214, 216. Apart from these design measures the resonance frequency is temperature dependent where the temperature dependence is usually expressed by the TCF parameter. The purpose of the acoustic mirror 230 is to acoustically decouple the BAW resonator from the underlying substrate 220, in order to limit the energy (dissipation) loss by acoustic waves propagating and leaking into the substrate 220.

The cross-sectional view of FIG. 1 shows one example for a so-called SMR BAW resonator (SMR=solidly mounted resonator), wherein the resonator, including of a bottom electrode (first electrode 214), the piezoelectric layer 212, and a top electrode (the second electrode 216), is mounted on top of a so-called acoustic mirror 230. The aforementioned acoustic mirror 230 includes a sequence of layers with alternating low and high acoustic impedances. Each individual mirror layer may feature a thickness of approximately λ/4, for example, wherein λ denotes the acoustic wavelengths of the longitudinal wave within the layer (which means that 1=λ/4, for example). It is to be noted that—for a given frequency—the wavelength λ depends on the layer material and that the acoustic mirror 230 acoustically decouples the resonator from the supporting substrate 220. As noted above, the resonance frequencies of such a BAW resonator, depend on the thicknesses of all layers, wherein the thickness d0 of the piezoelectric layer 212 includes the biggest influence, followed by the thickness of the electrode layers.

Frequency adjustments for an individual resonator of a BAW filter can be achieved by modifying one or more layers of the resonator's layer stack. This adjustment can include applying a lithography step and/or selectively etching some layer thickness away from one or more individual resonators. Alternatively, additional layer material can also be added, for example, on the second electrode 216, to change the resonance frequency of the corresponding BAW resonator.

Because a manufactured BAW resonator includes a resonance frequency only within a certain manufacturing tolerance (for example, +/−100 KHz), the trimming of the frequency is performed at the end when the second electrode layer 216 has been formed on the piezoelectric layer 212. Hence, the frequency tuning optionally includes as a first step a measurement in order to determine the actual resonance frequency (which is unknown or not known precisely enough due to manufacturing tolerance). When the actual resonance frequency is known, the layer thickness of the second electrode 216, for example, can be adjusted, either by adding additional layer material, or by etching some material away so that the second electrode layer 216 is either strengthened or thinned, thereby changing the resonance frequency of the BAW resonator. This is one conventional possibility to trim the resonance frequency of the BAW resonator. Other methods include, for example, employing an additional capacitance or inductance so that the resonance frequency is shifted to another value.

The manufacturing tolerance within which a BAW resonator can be manufactured depends on the newest technology and trimming capabilities. For example, the manufacturing tolerance includes an uncertainty of +/−50 KHz, or +/−100 KHz, or +/−500 KHz with respect to a target value for the resonance frequency, which can, for example, include a value between about 500 MHz and about 6 GHz, or between about 1.7 GHz and about 2.2 GHz, or around 1.9 GHz. Alternatively, the manufacturing tolerance results in an uncertainty in the resonance frequency within a region of +/−0.1%, or +/−0.2%, or +/−0.5% of the target resonance frequency.

Figure 2A:
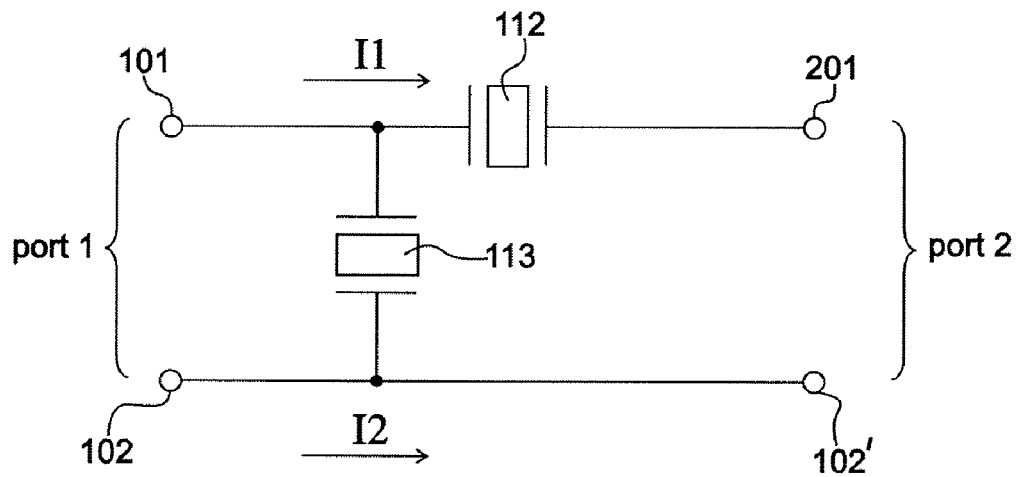
FIGS. 2a and 2b show a ladder and a lattice type filter section (filter stage), respectively.
Figure 2B:
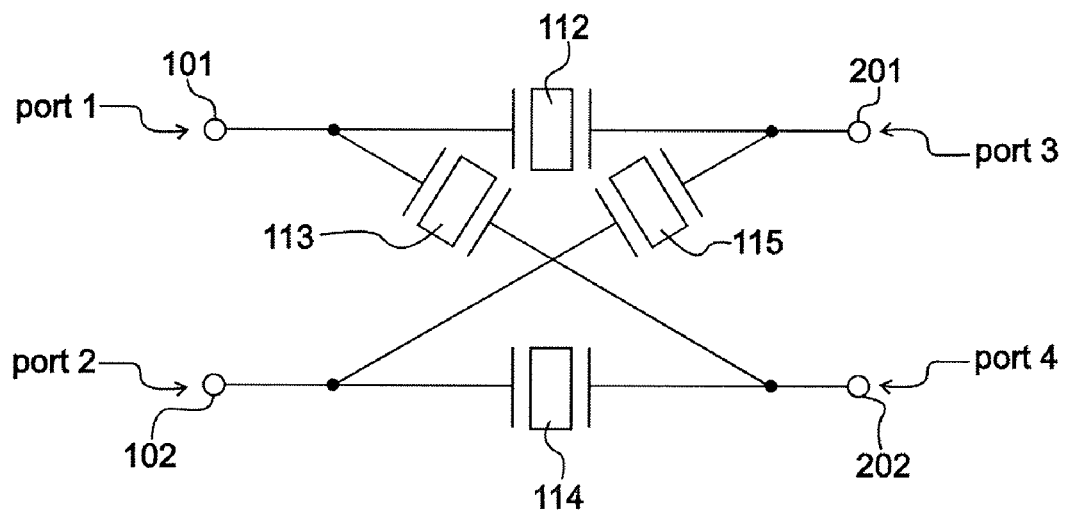

FIGS. 2a and 2b show simple examples for filter stages. A so-called single-ended (or single-to-single) filter topology stage is shown in FIG. 2a, including a first port (port 1) and a second port (port 2), the first port including a first terminal 101 and a ground terminal 102, the second port including a first terminal 201 and a ground terminal 102'.

FIG. 2a shows, as an example, one stage of a ladder-type filter including two BAW resonators, a series BAW resonator 112 and a shunt BAW resonator 113. The series BAW resonator 112 is connected in series between the terminal 101 of the first port and the terminal 201 of the second port. The shunt BAW resonator 113 connects the terminal 101 of the first port with ground (common ground for both ports).

FIG. 2b shows a lattice-type filter, which is an example for a balanced-to-balanced filter device and includes four BAW resonators in a single stage; a first series BAW resonator 112 and a second series BAW resonator 114, and a first shunt BAW resonator 113 and a second shunt BAW resonator 115. This filter (stage) is a four-port device, which is typically used in differential circuits. The first series BAW resonator 112 connects the terminal 101 of the port 1 with the terminal 201 of the port 3, and the second series BAW resonator 114 connects the terminal 102 of the port 2 with the terminal 202 of the port 4. The first shunt resonator 113 connects the terminal 101 of the first port with the terminal 202 of the port 4. The second shunt resonator 115 connects the terminal 102 of the second port with the terminal 201 of the port 3.

The filters as shown in FIGS. 2a and 2b are only simple examples and can be combined or extended by combining two or more of these filters to a multi-stage filter. In general, a first plurality of series BAW resonators and a second plurality of shunt BAW resonators are connected between the first and second port.

Figure 3:
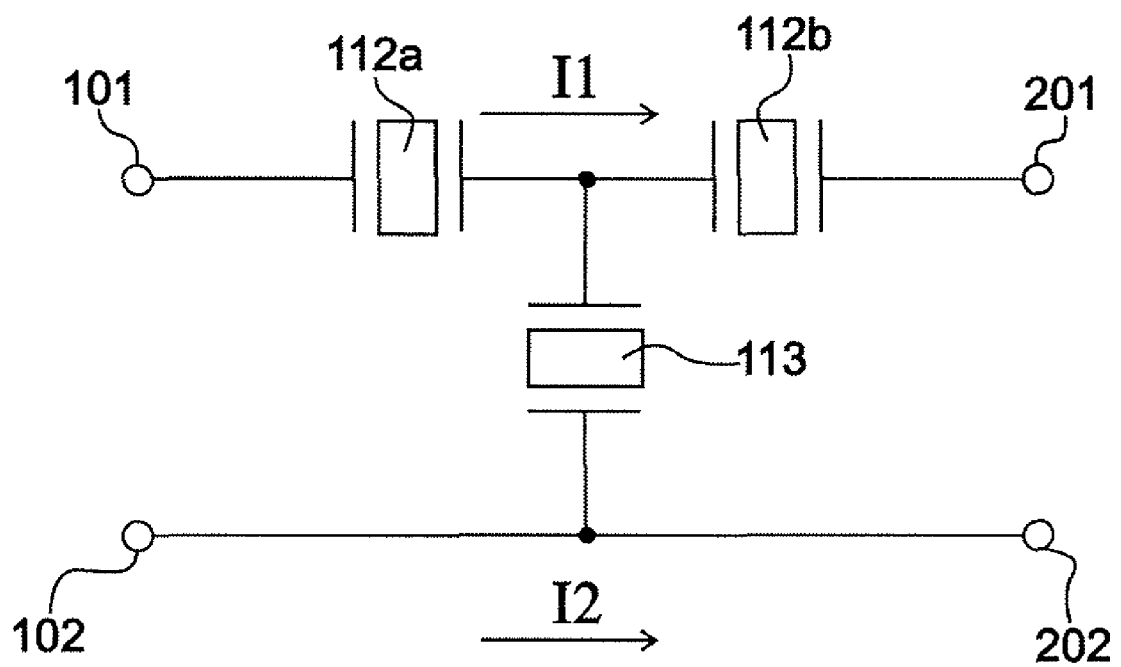
FIG. 3 shows a ladder type filter (section) with two serial and one shunt resonator corresponding to 1½ filter stages.

FIG. 3 shows a ladder-type filter including a first series BAW resonator 112a and a second BAW resonator 112b connected in series between the first terminal 101 of the first port and the first terminal 201 of the second port. The ladder-type filter moreover includes the shunt BAW resonator 113 connecting the common node of the first and second series BAW resonators 112a, 112b with the ground terminal 102 of the first port and the ground terminal 202 of the second port. The ladder-type filter in FIG. 3 is hence an example for a 1½ stage ladder filter, wherein the "½" stage corresponds to the addition series BAW resonator (e.g., the second series BAW resonator 112b), which is not accompanied by a shunt resonator.

According to embodiments, the resonance frequencies of the first and second series BAW resonators 112a and 112b differ by an amount, which is above a manufacturing tolerance. The amount is adjusted so that the ladder-type filter includes a roll-off behavior within a target specification. The target specification can, for example, include that the attenuation of an insertion loss or return loss signal from the 3 dB to the 30 dB frequency point is within a target frequency range (so that it is as deep as possible). The target specification depends on the target application for the filter (e.g., the gap between neighboring passbands). Possible target values for the frequency range (between the 30 and 3 dB point) can be below 18 MHz or below 12 MHz or below 9 MHz or below 6 MHz or below 3 MHz.

According to embodiments of the present invention, the resonance frequencies of the first and second series BAW resonators 112a and 112b deviates by an amount above the manufacturing tolerance, so that the first and second series BAW resonators 112a and 112b are resonance-frequency detuned with respect to each other. The resonance frequency of the shunt BAW resonator 113 can be arranged in a way that the ladder-type filter includes, for instance, a target value for the bandwidth of the passband. Here the three BAW resonators include an intentionally detuned resonance frequency with respect to each other.

Figure 4:
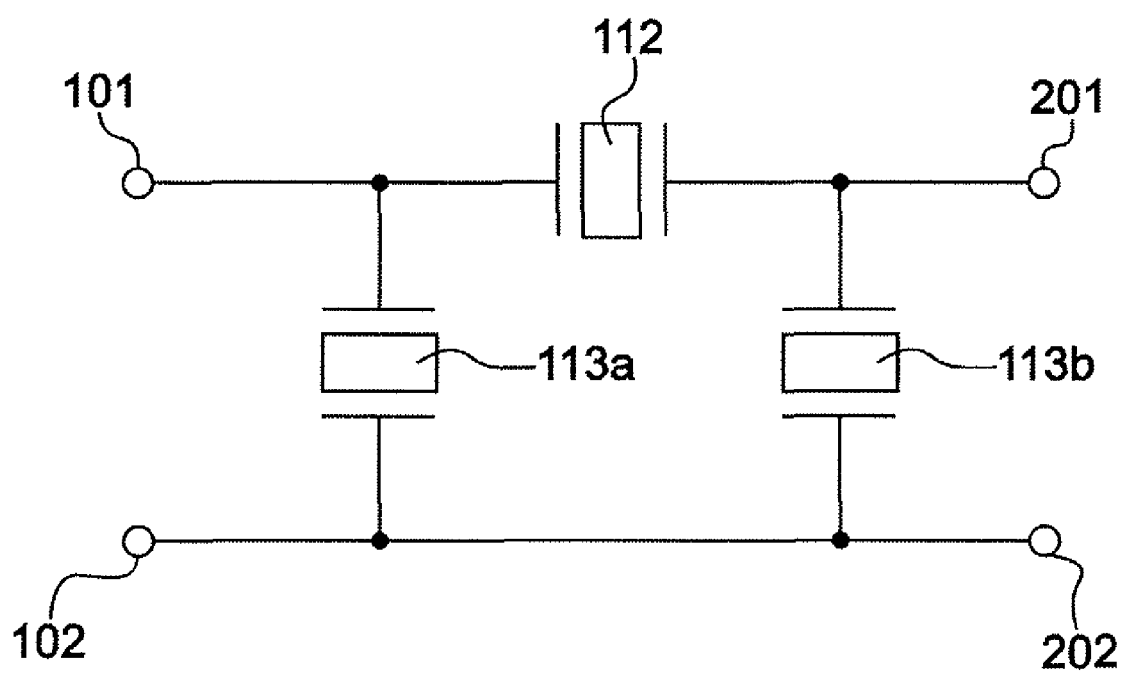
FIG. 4 shows a ladder type filter (section) with two shunt and one serial resonator corresponding to 1½ filter stages.

FIG. 4 shows a further embodiment of the present invention including a first shunt BAW resonator 113a and a second BAW shunt resonator 113b, and in addition, a series BAW resonator 112. The series BAW resonator 112 connects the first terminal 101 of the first port to the first terminal 201 of the second port. The first shunt BAW resonator 113a connects the first terminal 101 with the ground terminal 102 of the first port and, finally, the second shunt BAW resonator 113b connects the first port 201 of the second port with the ground terminal 202 of the second port. As in FIG. 3, also this embodiment gives a 1½ stage ladder filter, wherein now the "½" stage corresponds to the additional shunt BAW resonator (e.g., the second shunt BAW resonator 113b), which is not accompanied by a series BAW resonator.

According to embodiments of the present invention, the resonance frequencies of the first and second shunt BAW resonators 113a and 113b deviates by an amount above the manufacturing tolerance, so that the first and second shunt BAW resonators 113a and 113b are resonance-frequency detuned with respect to each other. The resonance frequency of the series BAW resonator 112 can, e.g., be adjusted in a way that the resulting ladder-type filter includes a target characteristic and especially that the ladder-type filter includes a target value, for instance, for the bandwidth of the passband. As in the embodiments, shown in FIG. 3, the three BAW resonators include an intentionally detuned resonance frequency with respect to each other.

FIG. 5 shows a combination of the two ladder-type filter sections as shown in FIGS. 3 and 4, together with an additional series BAW resonator 112d. This 3½ stage ladder filter thus includes a first series BAW resonator 112a, a second series BAW resonator 112b, a third series BAW resonator 112c, and a fourth series BAW resonator 112d. These four series BAW resonators 112a-d are combined with a first shunt BAW resonator 113a, a second shunt BAW resonator 113b, and a third shunt BAW resonator 113c. Each shunt resonator connects ground with a node between two adjacent series resonators or with a node of a single series resonator.

In further embodiments, also the lattice-type filters as shown in FIG. 2b can be combined with each other or with ladder-type filters, as shown in FIG. 2a. For such combined hybrid filters, the series BAW resonators are detuned with respect to each other and/or the shunt BAW resonators are detuned with respect to each other in a way to achieve an improvement of the filter's roll-off behavior.

The topology of the embodiments as shown in FIG. 5 includes a 3½ stage ladder filter with four series resonators 112a-d and three shunt resonators 113a-c. In a typical conventional ladder-type filter, all series resonators 112 include a same resonance frequency, and all shunt resonators 113 include the same resonance frequency. Series and shunt resonators are, however, detuned in their resonance frequencies by a certain amount that roughly corresponds to the resonator's bandwidth. The resonance frequencies of the shunt resonators 113a-c are lower than the resonance frequencies of the series BAW resonators 112a-d.

According to embodiments the resonance frequencies of at least two out of the four series BAW resonators differ by more than their manufacturing tolerance, which means that at least one of the series BAW resonators 112a-d is intentionally detuned to a value which improves the roll-off behavior.

In a further embodiment the resonance frequencies of at least two out of the three shunt BAW resonators 113a-c differ by an amount which is above their manufacturing tolerance. The amount can again be adjusted in a way that the roll-off behavior or the resulting ladder-type filter is improved. The detuning of the resonance frequencies of the series and/or shunt BAW resonators can be performed at the same time, which means that at least one of the series BAW resonators 112a-d, or at least one of the shunt BAW resonators 113a-c is detuned with respect to all other series or shunt BAW resonators, respectively, so that the filter characteristic includes an improved roll-off behavior.

Figure 5A:
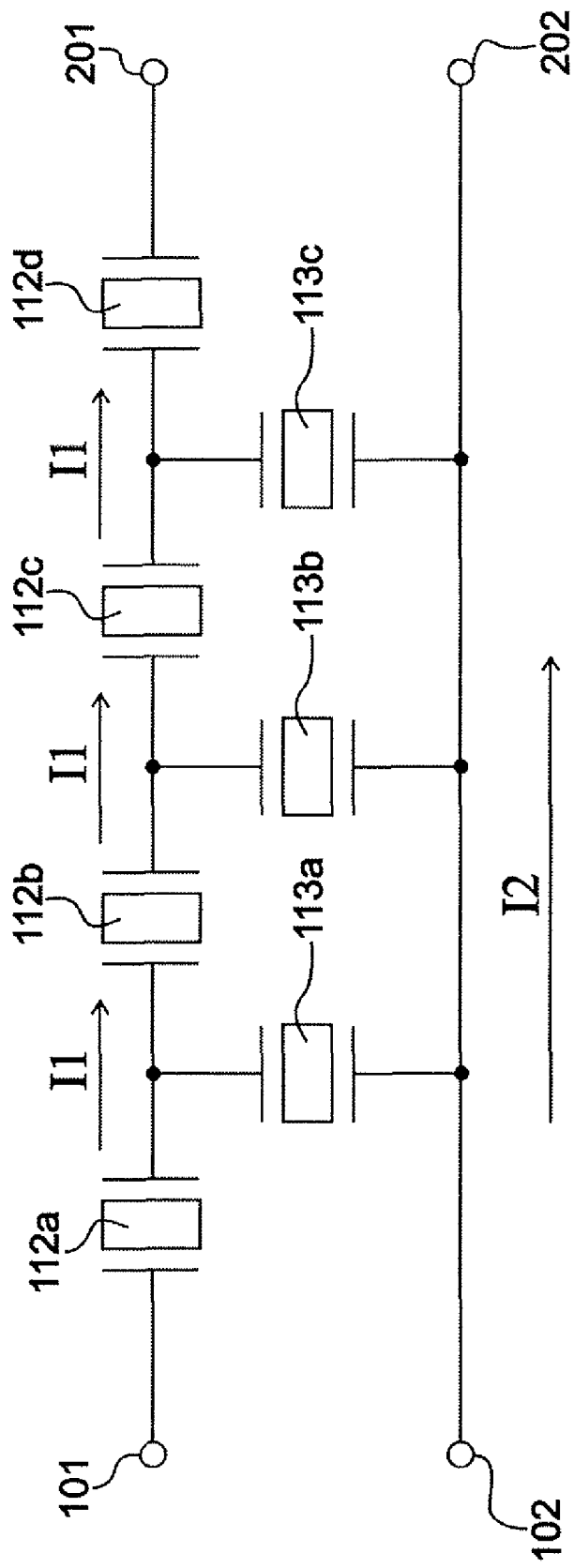
FIGS. 5a-d show combinations of different filter sections.
Figure 5B:
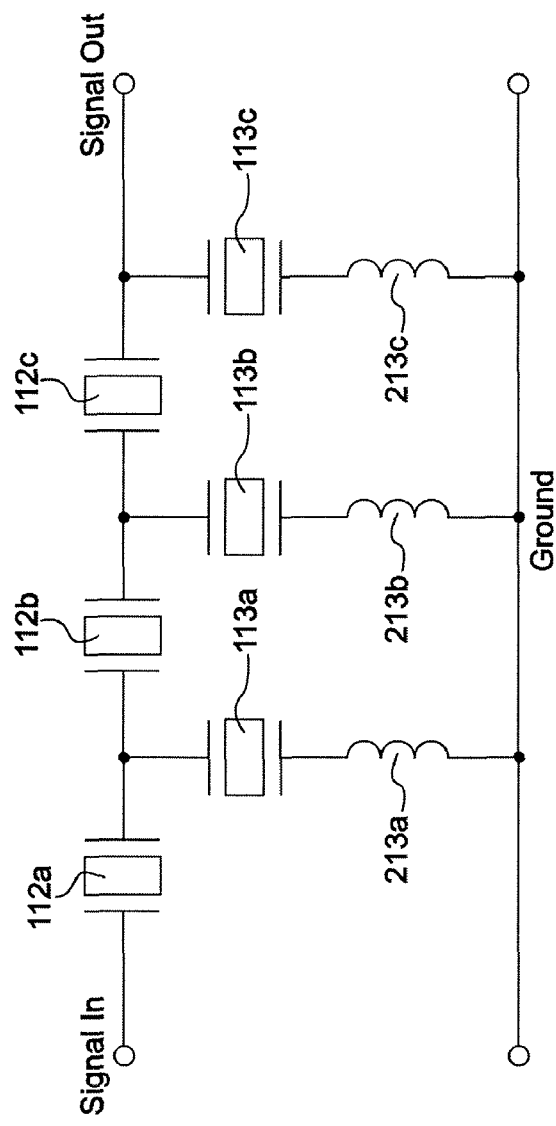
Figure 5C:
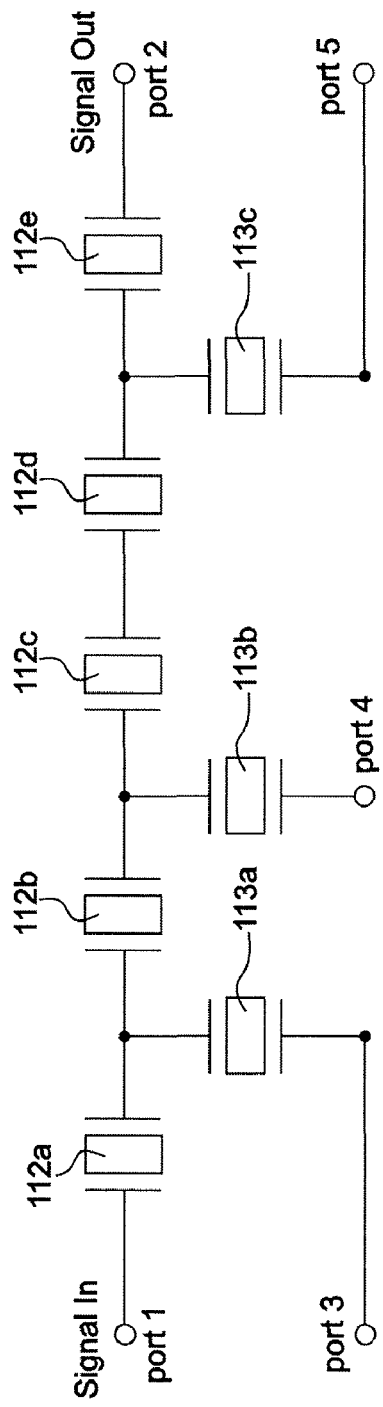

In another embodiment, on-chip inductances may be included in the shunt branches of the ladder filter, as shown in FIG. 5b Alternatively, additional or parasitic inductances may be included in the filter or duplexer package, for example, see FIG. 5c. In such a case, the on-chip circuit is no longer a simple two-port device, but offers additional ports which are connected to ground within the filter or duplexer package. Such connections may include inductors or parasitic inductances, as provided by wire bonds or vias.

In detail, FIG. 5b shows a combination of two ladder type filter sections as shown in FIGS. 3 and 4. The combination includes a first series BAW resonator 112a, a second serial BAW resonator 112b and a third series BAW resonator 112c connected in series between a Signal In and a Signal Out port. The remaining two ports include a ground terminal. As in FIG. 5a these three series BAW resonators are combined with a first shunt BAW resonator 113a, a second shunt BAW resonator 113b and a third shunt BAW resonator 113c. In addition to the embodiment as shown in FIG. 5a, the embodiment of FIG. 5b includes a first inductor 213a which is connected in series with the first shunt BAW resonator. A second inductor 213b is connected in series with the second shunt BAW resonator 113b and a third inductor 213c is connected in series with the third shunt BAW resonator 113c (recall, the inductors may include additional or parasitic inductances). Therefore, in comparison to the embodiment as shown in FIG. 5a each shunt BAW resonator 113a,b,c is replaced by a series connection of a BAW shunt resonator and an inductor such that each inductor connects the shunt BAW resonator with the ground terminal.

FIG. 5c shows a further embodiment including five ports, a port 1, a port 2, a port 3, a port 4 and a port 5. Port 1 includes, for example, a signal input (Signal In) and port 2 includes, for example, a signal output (Signal Out). Five series BAW resonators (the first series BAW resonators 112a, ..., a fifth series BAW resonator 112e) are connected in series between port 1 and port 2. The first shunt BAW resonator 113a is connected between port 3 and a node between the first series BAW resonator 112a and the second series BAW resonator 112b. The second shunt BAW resonator 113b is connected between port 4 and a node between the second series BAW resonator 112b and the third BAW resonator 112c. The third shunt BAW resonator 113c is connected between port 5 and a node between the fourth series BAW resonator 112d and the fifth series BAW resonator 112e. In further embodiments the first, second and third shunt BAW resonators are connected to different nodes between adjacent series BAW resonators. For example, the second shunt BAW resonator may also be connected to a node between the third and fourth series BAW resonators 112c,d. Similarly, the first and third shunt BAW resonators 113a,c can be connected to different nodes between different adjacent series BAW resonators. A structure like the one shown in FIG. 5c can, for example, be realized as a BAW filter chip. The ports 3, 4, and 5 can then be connected to ground by means of wire bonding or flip-chip bonding within a package. Doing so, circuit topologies as shown in FIG. 5c are converted into single-to-single ladder-type BAW filter topologies as shown in FIG. 5b, for example.

Figure 5D:
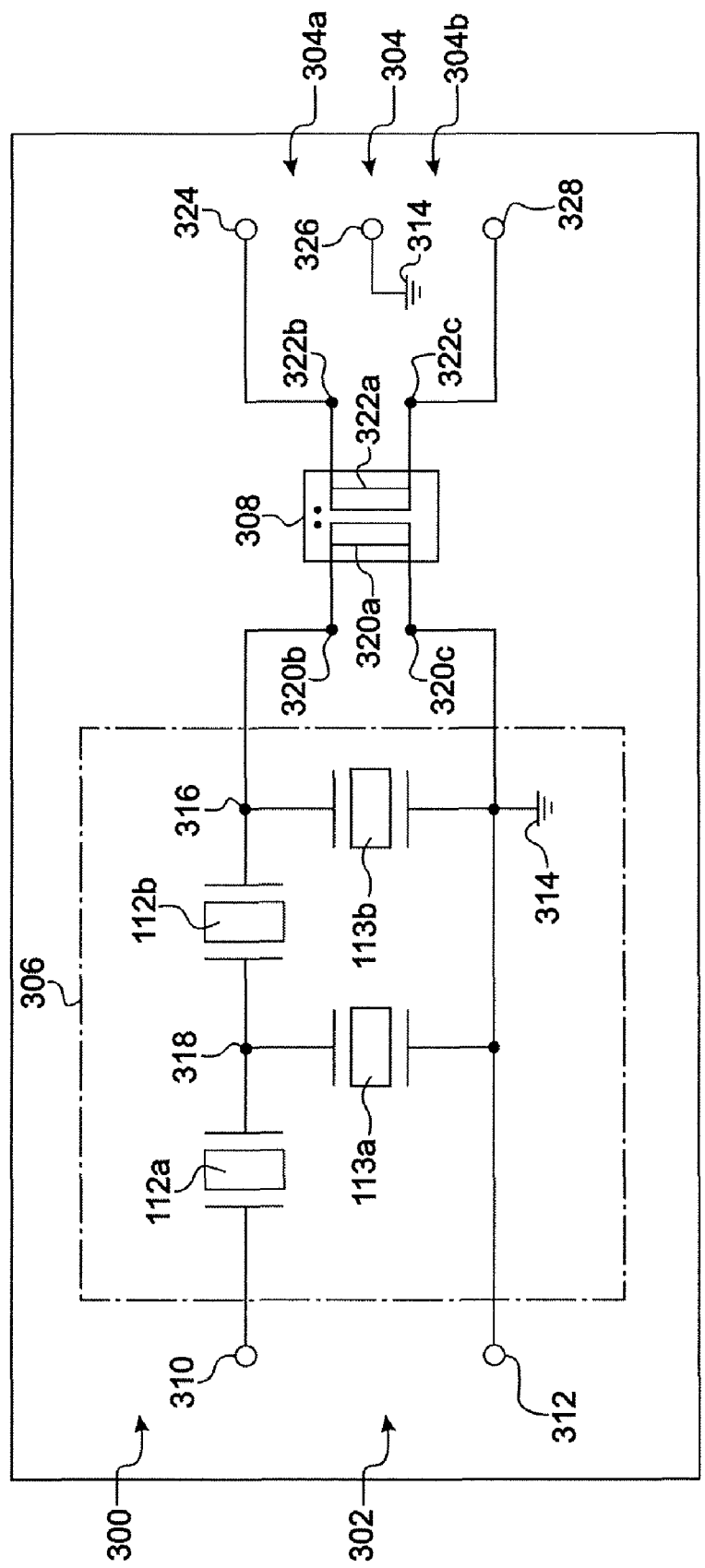

FIG. 5d shows an embodiment of a single-to-balance filter section including a filter circuit 300 with an unbalanced terminal 302 and a balanced terminal 304 with the two balanced ports 304a and 304b. A series circuit including a ladder type filter stage 306 and a balun 308 is connected between the unbalanced terminal 302 and the balanced terminal 304. In the embodiment illustrated in FIG. 5d, the filter stage 306 is an unbalanced filter stage in the form of a ladder filter as it has been described exemplarily with regard to FIGS. 3 to 5a. The filter stage 306 includes two series resonators 112a and 112b as well as two shunt resonators 113a and 113b.

The unbalanced terminal 302 includes a first node 310 and a second node 312. The second node 312 is connected to a reference potential 314, e.g., ground. The filter stage 306 includes a series circuit including the two series resonators 112a and 112b connected between the first node 310 and a third node 316. The first parallel resonator 113a is connected between the reference potential 314 and a node 318 between the first series resonator 112a and the second series resonator 112b. The second parallel resonator 113b is connected between the third node 316 and the reference potential 314.

The balun 308 is formed, for example, by two coupled coils 320a and 322a, wherein a first terminal 320b of the first coil 320a is connected to the third node 316. A second terminal 320c or the first coil 320a is connected to the reference potential 314.

The first port 304a of the balanced terminal 304 includes a first node 324 as well as a second (reference) node 326 connected to the reference potential 314. Also, the second port 304b includes a first terminal 328 and also the (reference) node 326 shared with the first port 304a. The balanced signals are tapped and received, respectively, between the nodes 324 and 326 and the nodes 328 and 326, respectively.

A first terminal 322b of the second coil 322a of the balun 308 is connected to the first node 324 of the first balanced port 304a. A second terminal 322c of the second coil 322a is connected to the first node of the second balanced port 304b.

Thus, FIG. 5d shows a topology of a ladder filter combined with a balun. The filter itself has a ladder structure and can have more than the two stages shown there to improve selectivity.

In further embodiments a lattice type filter section (e.g. as shown in FIG. 2b) is connected to the balanced terminal 304. In addition, the balun 308 may optionally be replaced by an acoustically coupled resonator filter or another single-to-balanced signal transformer, which provides a single-to-balanced signal conversion (and vice versa).

Also for the single-to-balanced filter resonance frequencies of at least two of the series and/or shunt BAW resonators are detuned according to embodiments, so that the filter characteristic includes an improved roll-off behavior.

FIGS. 6a-f show the performance improvement of a typical BAW filter achieved by the proposed individual resonator frequency adjustments. The roll-off behavior on the left filter skirt of an exemplary PCS TX-band is improved by approximately 1.7 MHz, whereas the roll-off on the right filter skirt is improved by approximately 2 MHz, wherein the improvements are given by the difference between the 30 dB and 3 dB frequency points. At the same time the insertion loss at the upper passband edge improves by around 1 dB (or better). This generates a performance and yield margin at the upper passband frequency edge. The frequency shift between the series resonators with the highest frequency (for example, the first series BAW resonator 112a and the fourth series BAW resonator 112d), and the series resonator with the lowest frequency (which is, for example, the second series BAW resonator 112b), is approximately 4.9 MHz (in this example). The frequency shift between the shunt resonator with the highest frequency (for example, the second shunt BAW resonator 113b) and the shunt resonator with the lowest frequency (for example, the first shunt BAW resonator 113a) include approximately 9 MHz (in this example). According to embodiments these frequency shifts are above the manufacturing tolerance of around 100 kHz or 500 kHz. Manufacturing tolerances include suitable trimming procedures for the BAW resonators. The achieved improvements do not affect the stopband or wideband attenuation behavior of the filter.

Figure 6A:
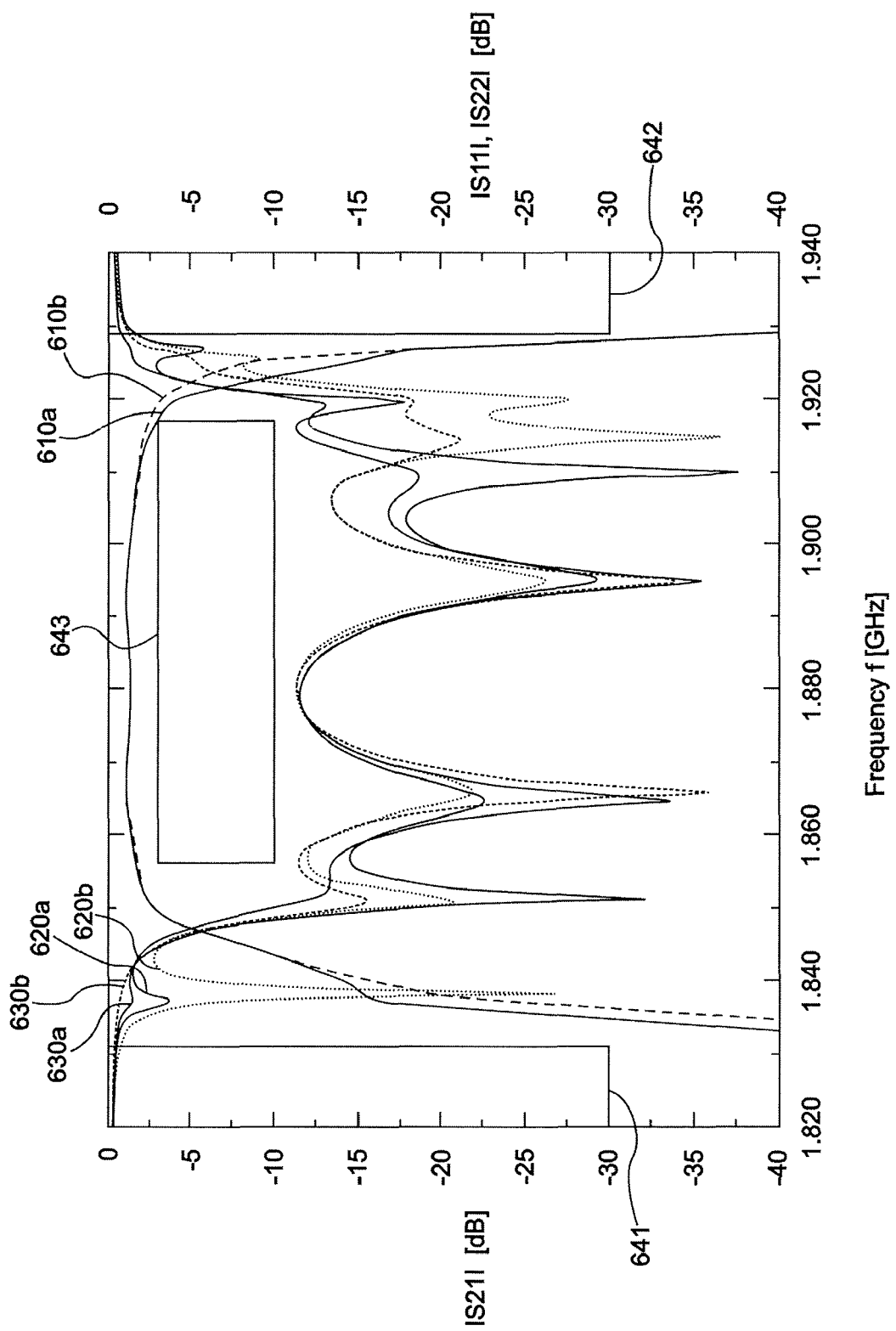
FIGS. 6a-f show a performance improvement of a typical BAW filter according to embodiments of the present invention.

FIG. 6a shows insertion loss and return loss signals of a BAW filter, wherein the BAW filter is, for example, a ladder-type filter as shown in FIG. 5 including four series resonators and three shunt resonators. The insertion loss and return loss signals are measured in dB and shown as function of the frequency within a frequency range from 1.82 to 1.94 GHz. As an example a PCS TX-band filter is shown. The regions 641 and 642 represent the stopband attenuation specification, and the region 643 represents the passband specifications for insertion loss (upper line) and return loss (lower line). The specifications are drawn for an individual chip, taking into account effects and frequency shifts from later packaging.

In detail, FIG. 6a shows the insertion loss signals |S21|, a first return loss signal |S11| (corresponding to port 1) and a second return loss signal |S22| (corresponding to port 2). For each signal two graphs are shown, one graph showing the filter characteristic corresponding to a standard (state-of-the-art) design method (drawn by a solid curve) and one graph showing the optimized design according to embodiments of the present invention (drawn by a dashed curve). Hence, the following graphs are shown: a conventional insertion loss signal 610a and an optimized insertion loss signal 610b, a conventional first return loss signal 620a and a corresponding first return loss signal 620b for the roll-off-optimized design, a conventional second return loss signal 630a and a corresponding second return loss signals 630b for the roll-off-optimized design.

Figure 6B:
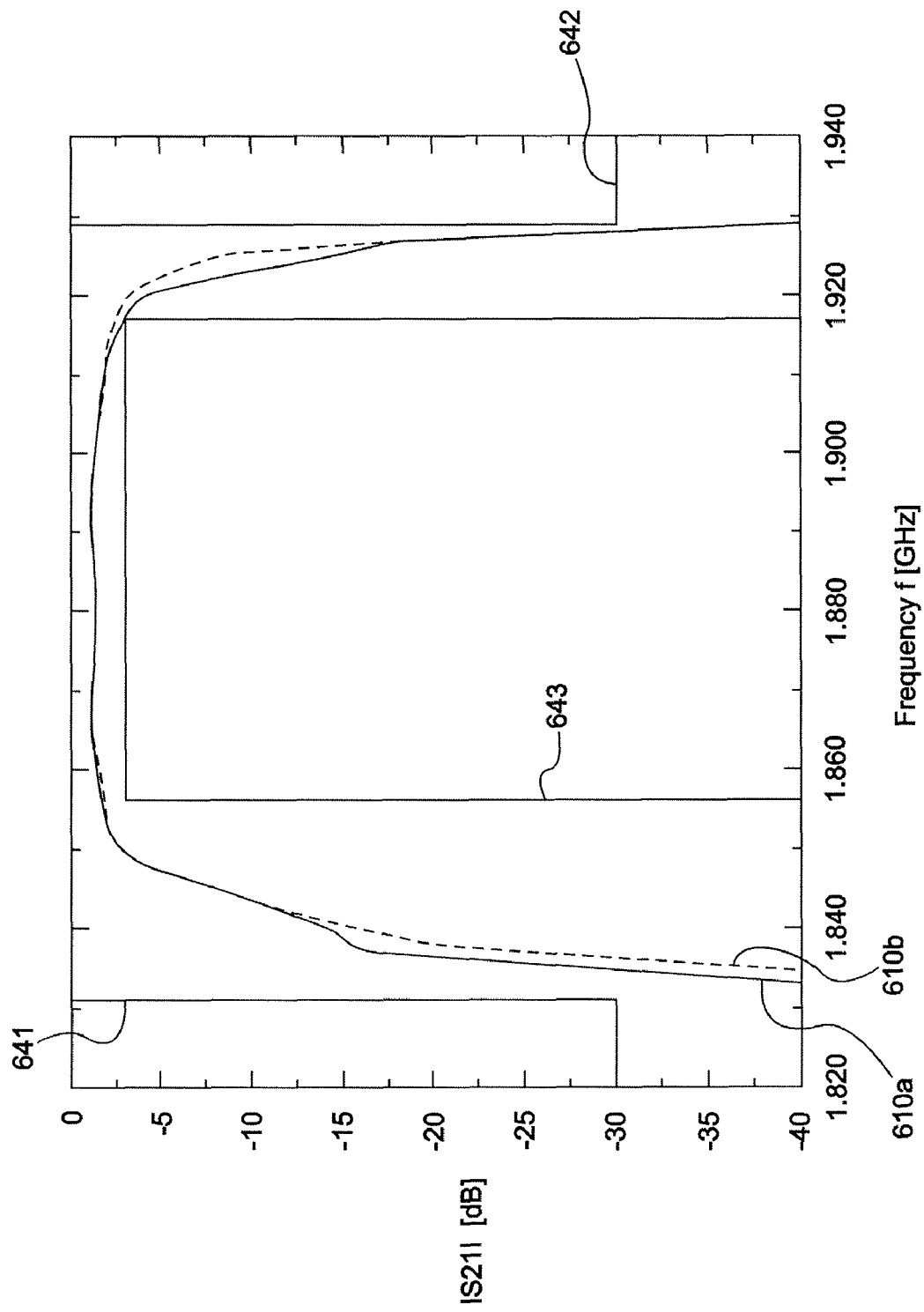

FIG. 6b shows the improved roll-off of the insertion loss signal |S21| as function of the frequency for the passband region 643. The first insertion loss signal 610a as drawn with a solid line and corresponds to a standard design filter, whereas the optimized insertion loss signal 610b is drawn with a dashed line and corresponds to an optimized design related to a detuning of at least one series and/or at least one shunt resonator. Within the passband range 643 both graphs rarely deviate from one another, but on the right hand side (right filter skirt) and on the left hand side (left filter skirt) the optimized insertion loss signal 610b related to embodiments of the present invention shows an improved roll-off behavior in the sense that the graph is more steep than the conventional insertion loss signal 610a.

In the filter design it is important that the insertion signal is almost flat in the passband frequency range 643 with very small attenuation and falls off rapidly enough outside the passband frequency range 643 so that the insertion signal does not violate any stopband (forbidden) region 641 or 642. This means that the insertion loss signal should especially on the right hand side of the pass band range 643 roll off rapidly enough in order to stay within the corridor between the stopband region 642 and the passband frequency range 643. As the graphs in FIG. 6b show the conventional filter (shown by the solid line 610a) rarely fits into the corridor between the stopband region 642 and the passband region 643.

Figure 6C:
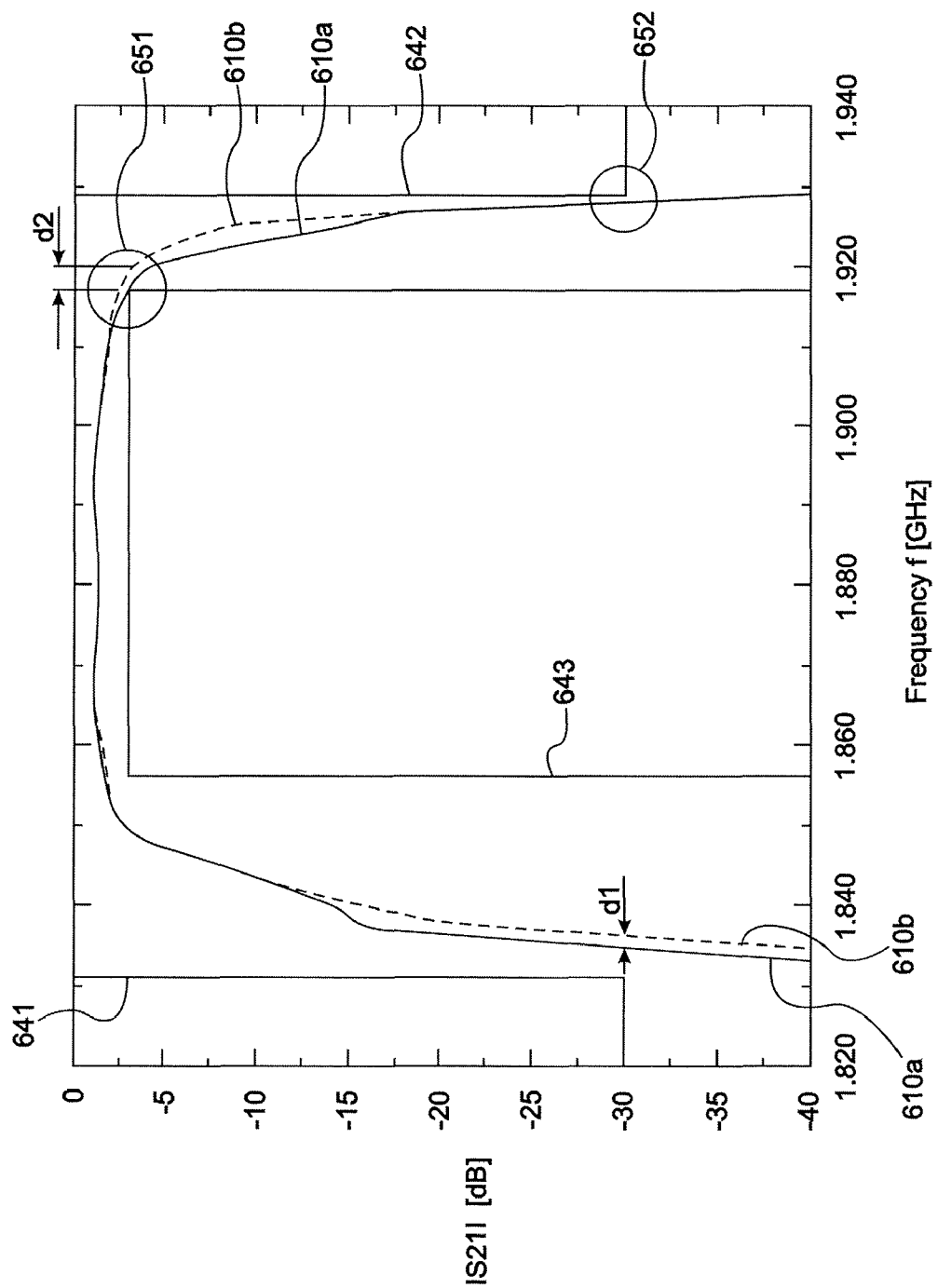

FIG. 6c shows in detail how embodiments improve the roll-off behavior on the right and left filter skirt. On the right filter skirt, a roll-off improvement is achieved by a frequency shift d2 shown in the region 651 so that the optimized insertion signal 610b exhibits a frequency gap towards the passband frequency range 643. This frequency gap includes approximately 2 MHz so that the optimized insertion loss signal 610b does not touch or stays well outside the pass band frequency range 643, which was not the case for the conventional filter (related to the conventional insertion loss signal 610a). At the same time, both insertion loss signals do not deviate from each other near the stopband zone 642 so that there is still a frequency gap as shown in the region 652. Therefore, especially the right filter skirt is improved, which is of great advantage since it improves the manufacturing yield significantly.

On the other hand, on the left filter skirt, the optimized filter exhibits an optimized insertion loss signal 610b, which also falls off faster than the conventional insertion loss signal 610a. This improvement measured, for example, as frequency shift d1 of the signal between the 3 dB and 30 dB points, includes for this example a value of around 1.7 MHz. It is to be noted that a shift of the central frequency of the passband towards higher frequencies would not solve the problem that the conventional insertion signal 610a hits the passband frequency range 643, because the shift would violate the stopband 642 within the region 652 and hence would create a new problem. Therefore a shift of the whole passband is not an allowable measure to improve the passband quality within the passband frequency range 643. In contrast to this, embodiments solve this problem by a faster roll-off behavior of the insertion loss signal |S21| without creating a new problem.

Figure 6D:
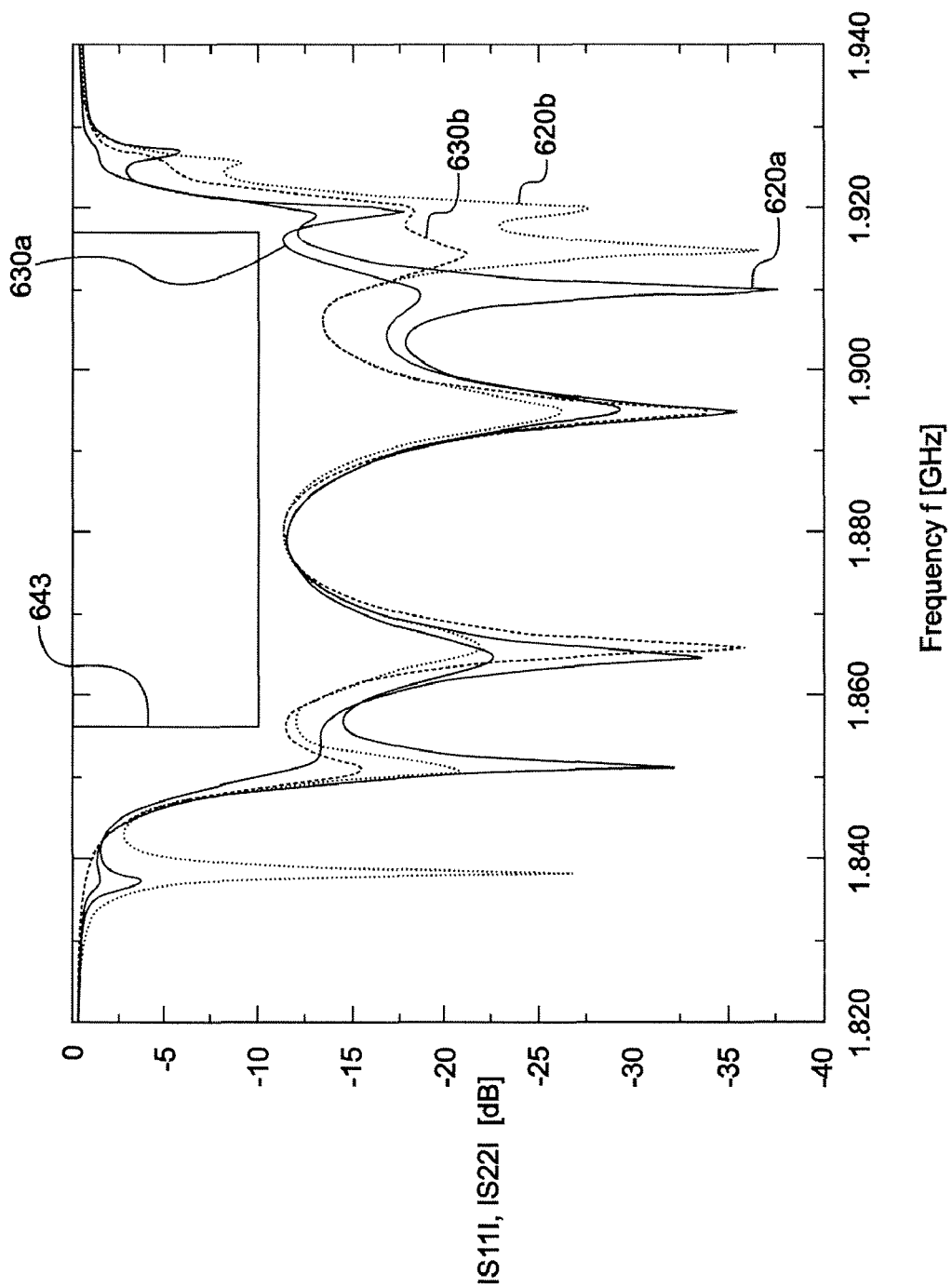

FIG. 6d shows the first return loss signal |S11| for the filter input (port 1) and the second return loss signal |S22| for the filter output (port 2). Both signals differ again in the roll-off-optimized design (graphs in dashed lines) from the corresponding return loss signals in the conventional designs (graphs in solid lines), but exhibit a same performance over the whole passband frequency range 643. It is important to realize that embodiments allow a significant improvement in the roll-off behavior (especially at the upper passband frequency edge) and the filter bandwidth without degrading the reflection behavior (as shown by return loss signals).

Again, the passband frequency range 643 is indicated by a rectangle, which should not be violated by the return loss signals |S11| and |S22|, in order to ensure proper matching of both input and output ports. The return loss signals are again drawn as graphs showing a conventional filter design and an optimized filter design according to embodiments.

Figure 6E:
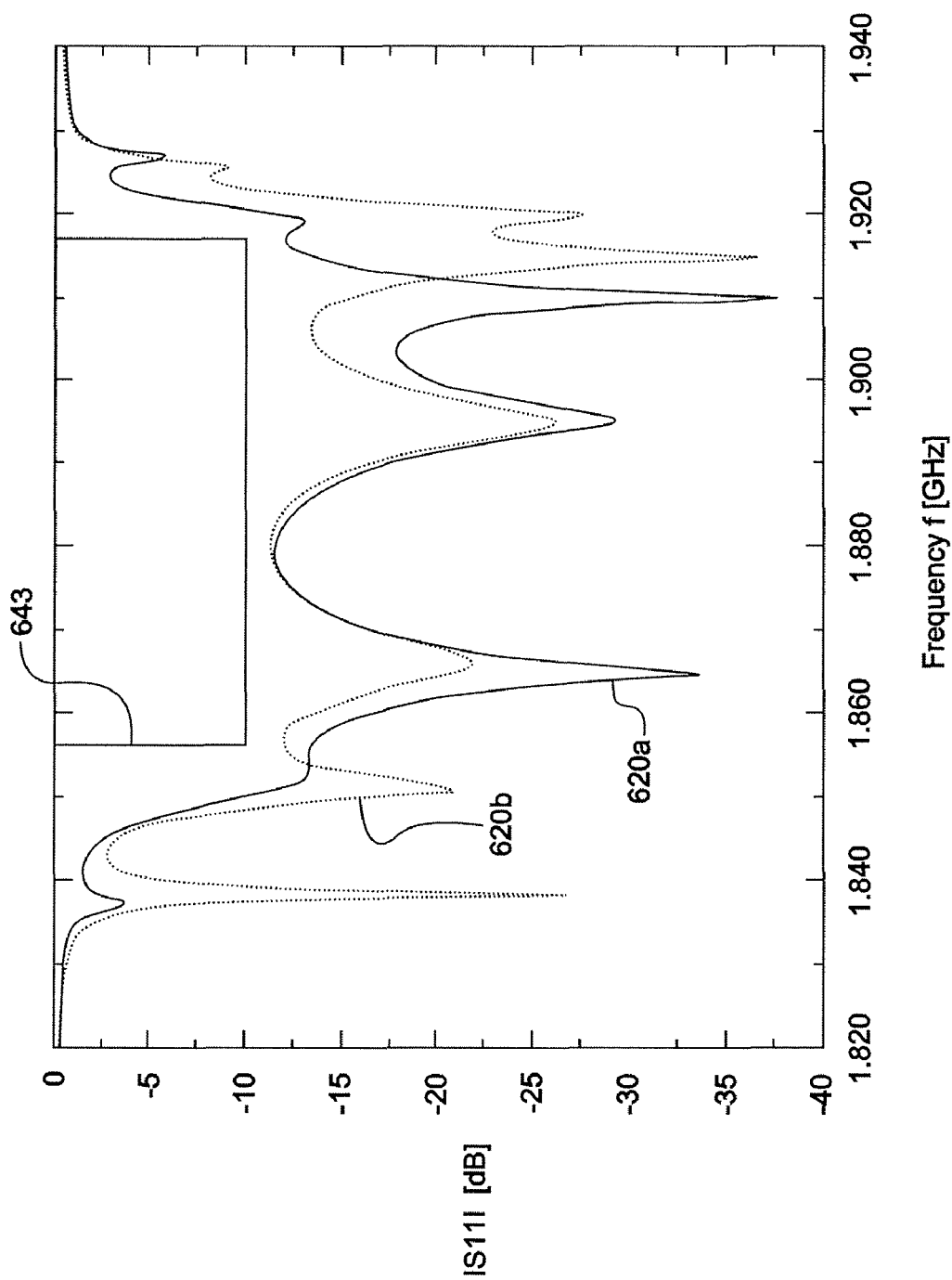

FIG. 6e shows the first return loss signal |S11|, a conventional first return loss signal 620a and the first return loss signal 620b from the roll-off-optimized design, wherein the first return loss signals are measured with respect to the input port or port 1.

As before also the first return loss signal S11 exhibits an improved behavior at the right and left filter skirt so that the optimized first return loss signal 620b shows a bigger frequency gap to the passband frequency range 643, when compared to the conventional first return loss signal 620a. Outside the passband (below 1.83 GHz and above 1.93 GHz), both first return loss signals rarely deviate from one another and the main improvements are within the transition regions, that means between the passband frequency range 643 and the first and second forbidden zones 641 and 642.

Figure 6F:
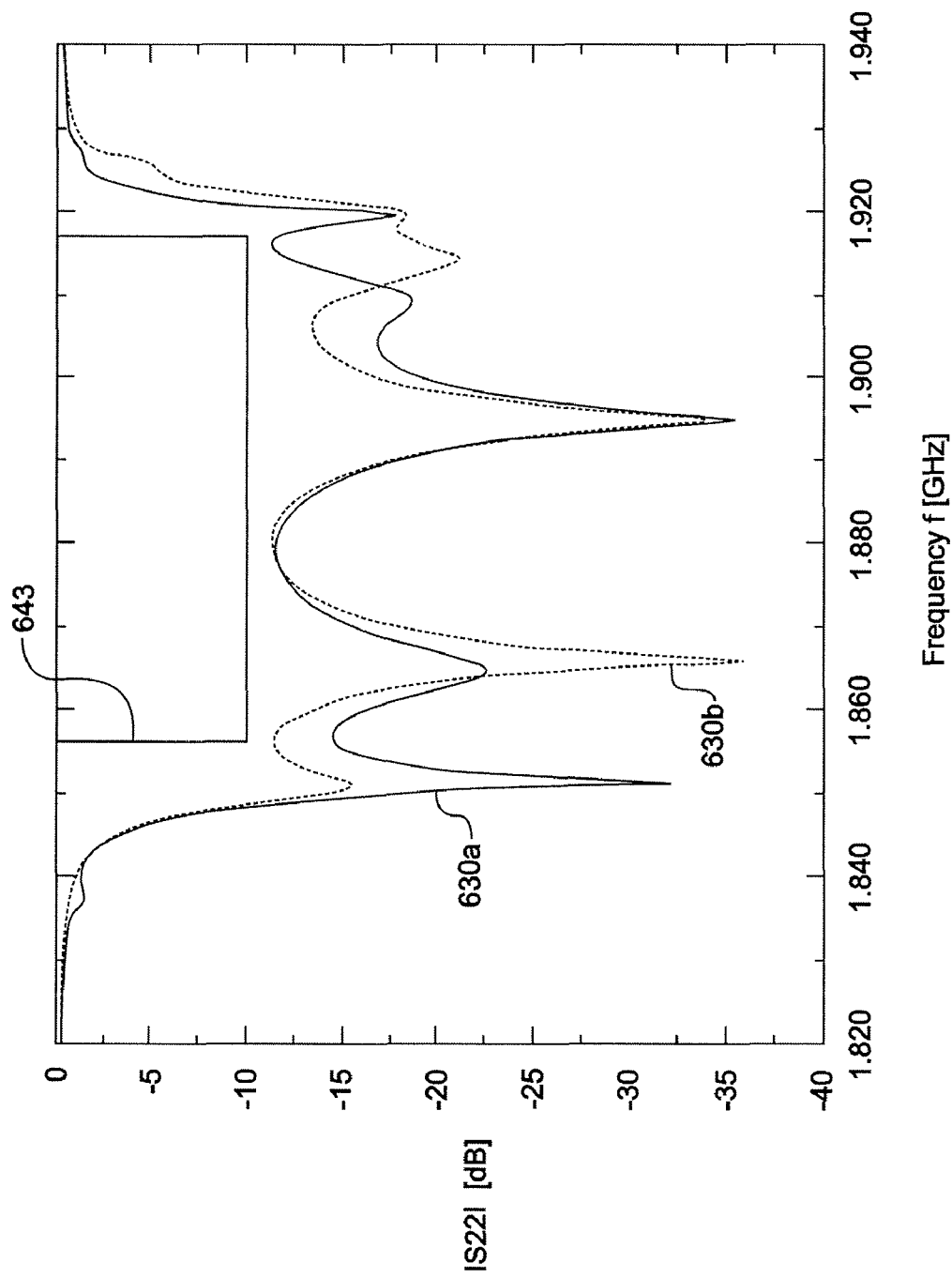

FIG. 6f shows the second return loss signals |S22| related to the output port or port 2 so that this signal measures the reflected signal at the second port. The conventional second return loss signal 630a relates again to a standard design whereas the optimized second return loss signal 630b (in dashed lines) relates to a roll-off-optimized design corresponding to embodiments of the present invention. As for the first return loss signals S11 shown in FIG. 6e, also for the second return loss signal S22 both graphs do not deviate outside the passband frequency range 643, but show significant improvements within the transition regions. The local maxima within the passband frequency range 643 for the conventional and optimized second return loss signal 630a,b are of the same level and therefore the improvement with respect to the faster roll-off at the filter skirts do not worsen the filter behavior within the passband frequency range 643. The first and second return loss signals should be, for example, over the passband frequency range 643 below 8 dB or below 10 dB or better below 12 dB, which is the case the embodiment as shown in FIG. 6d-f.

These graphs demonstrate the power of the proposed method on a PCS TX ladder filter. Current technology as well as current design, offer an upper passband edge roll-off of 9 MHz+/−0.1 MHz. This roll-off performance can be considered as a lower bound, as process parameter variations easily increase the roll-off. For this filter, the roll-off parameter is the most critical parameter and actually limits the production yield. FIG. 5 showed an example of a PCS TX filter based on a 3½ stage ladder topology, and FIGS. 6a-e showed the corresponding improvements. For this filter, it is essentially the roll-off at the upper passband edge, which determines the yield. But for other filters, also the lower passband edge can determine the yield, so that for other embodiments the roll-off behavior especially for the lower passband edge should be optimized.

As part of the specification of a BAW filter, the return loss signal (the attenuation of a reflected signal) should include a minimal value, meaning that the attenuation should be better than, for example, −12 dB or better than −8 dB over the whole passband.

In further embodiments, the detuning of BAW resonators is done with respect to the stages of ladder-type filters, meaning that BAW resonators of a second stage deviates in their resonance frequency from the BAW resonators including a first stage.

In further embodiments, at least one of the first and second electrodes include an assembly of layers with materials of different acoustic impedances and different electrical conductivities as, for example, aluminum (Al), tungsten (W), molybdenum (Mo), palladium (Pa). Especially Al and Mo include high conductivities and Mo and W include high acoustic impedances. A principle benefit of constructing electrodes including a plurality of layers is to combine suitable acoustic and electrical conductivity properties for the benefit of a higher effective electromechanical coupling coefficient of the resulting resonator. Increased effective electromechanical coupling results in larger resonator bandwidths, thus enabling larger filter bandwidths.

In general, the piezoelectric layers can include one or more different layers, of which at least one exhibits a piezoelectric activity. The other layers between the top and bottom electrode, which sandwich the piezoelectric layer, can be a non-piezoelectric-active dielectric or other layers to achieve special performance effects like temperature coefficient compensation or to facilitate manufacturing like adhesion layers. In addition, the other layers are typically thin when compared to the piezoelectric layer.

Finally, possible materials for layers with high acoustic impedance include, for example: W, Mo, Pt, Ta, TiW, TiN, Ir, WSi, Au, $Al_2O_3$, SiN, $Ta_2O_5$ and zircon-oxide, wherein the last four are dielectrical materials. Possible materials for the piezoelectric layers are, for example, AlN, ZnO, PZT and $LiNbO_3$. A material for lower acoustic impedance is, for example, aluminum.

What is claimed is:

1. A bulk acoustic wave (BAW) filter device, comprising:
   at least one first serial BAW resonator;
   at least one first shunt BAW resonator;
   at least one second serial BAW resonator or at least one second shunt BAW resonator,
   wherein the resonance frequencies of the first and the second serial BAW resonators or the resonance frequencies of the first and the second shunt BAW resonators are detuned with respect to each other and the resonance frequencies are detuned beyond a detuning obtained due to manufacturing tolerances.

2. The BAW filter device of claim 1, wherein the resonance frequencies are detuned by about 0.1% to about 0.2% or by more than 0.2% of a mean resonance frequency of the respective BAW resonators.

3. The BAW filter device of claim 1, wherein the resonance frequencies are detuned by about 1 MHz to about 4 MHz or by more than 4 MHz.

4. The BAW filter device of claim 1, wherein the shunt BAW resonators are coupled to a reference terminal.

5. The BAW filter device of claim 1, wherein the shunt BAW resonators are directly coupled to the reference terminal or are coupled to the reference terminal via one or more further circuit elements.

6. The BAW filter device of claim 4, wherein the reference terminal is the ground terminal.

7. A single-to-single type BAW filter device, comprising:
   a plurality of filter stages, each filter stage comprising a serial BAW resonator and a shunt BAW resonator,
   wherein the shunt BAW resonators of the plurality of filter stages are coupled to a reference terminal, and
   wherein in at least two filter stages' BAW resonators of the same type are detuned with respect to each other and the resonance frequencies of at least two filter stages' BAW resonators are detuned beyond a detuning obtained due to manufacturing tolerances.

8. The single-to-single type BAW filter device of claim 7, comprising:
   a first filter stage comprising a first serial BAW resonator and a first shunt BAW resonator;
   a second filter stage comprising a second serial BAW resonator and a second shunt BAW resonator; and
   a third filter stage comprising a third serial BAW resonator and a third shunt BAW resonator,
   wherein at least the first and third serial BAW resonators or the first and third shunt BAW resonators are detuned.

9. The single-to-single type BAW filter device of claim 8, comprising a further serial BAW resonator forming a ½ stage or a further shunt BAW resonator forming a ½ stage coupled to one of the filter stages.

10. A balanced-to-balanced BAW filter device comprising:
    a lattice filter stage comprising:
       a first input port comprising a first terminal;
       a second input port comprising a first terminal;
       a first output port comprising a first terminal;
       a second output port comprising a first terminal;
       at least one first serial BAW resonator connected between the first terminal of the first input port and the first terminal of the first output port;
       at least one second serial BAW resonator connected between the first terminal of the second input port and the first terminal of the second output port;
       at least one first shunt BAW resonator connected between the first terminal of the first input port and the first terminal of the second output port; and
       at least one second shunt BAW resonator connected between the first terminal of the second input port and the first terminal of the first output port,
    wherein the first and second serial BAW resonators or the first and second shunt BAW resonators are detuned with respect to each other and the resonance frequencies of the detuned BAW resonators are detuned beyond a detuning obtained due to manufacturing tolerances.

11. The balanced-to-balanced BAW filter device of claim 10, comprising a plurality of filter stages connected in series.

12. The balanced-to-balanced BAW filter device of claim 11, wherein series BAW resonators from different filter stages are detuned with respect to each other and/or wherein shunt BAW resonators from different filter stages are detuned with respect to each other,
    wherein the detuning is such that at least two series BAW resonators or at least two shunt BAW resonators comprise resonance frequencies differing by an amount beyond manufacturing tolerances.

13. The balanced-to-balanced BAW filter device of claim 10, comprising ladder-type filter stages connected in series to the first and second input ports or to the first and second output ports of the lattice-type filter stage, each ladder-type filter stage comprising at least one serial BAW resonator and at least one shunt BAW resonator.

14. A single-to-balanced BAW filter device comprising:
a single-to-balanced signal transformer comprising a unbalanced port and an balanced port;
the single-to-single type BAW filter device of claim 7 connected to the unbalanced port; or
the balance-to-balanced type BAW filter device of claim 10 connected to the balanced port.

15. A method for manufacturing a bulk acoustic wave (BAW) filter device comprising an optimized roll-off behavior, the method comprising:
forming a first serial BAW resonator;
forming a first shunt BAW resonator;
forming a second serial BAW resonator or a second shunt BAW resonator; and
actively detuning the resonance frequencies of the first and the second serial BAW resonator or the resonance frequencies of the first and the second shunt BAW resonator with respect to each other beyond a detuning obtained due to manufacturing tolerances, wherein the detuning is performed such that a roll-off at a passband frequency edge becomes smaller when compared with the roll-off before detuning.

16. A method for optimizing the roll-off behavior of a BAW filter device, the BAW filter device comprising at least one first serial BAW resonator, at least one first shunt BAW resonator and at least one second BAW resonator, the second BAW resonator being a further serial or a further shunt BAW resonator, the method comprising:
actively detuning the resonance frequency of the at least one second BAW resonator beyond a detuning obtained due to manufacturing tolerances, wherein the detuning is performed such that a roll-off at a passband frequency edge becomes smaller when compared with the roll-off before detuning.

17. The method of claim 16, wherein the detuning is performed such that the insertion loss and the return loss performance levels within the passband remain unchanged or are improved.

* * * * *